(12) United States Patent
Lin et al.

(10) Patent No.: US 6,746,823 B2
(45) Date of Patent: Jun. 8, 2004

(54) FABRICATING PROCESS OF NON-GAP 3-D MICROSTRUCTURE ARRAY MOLD CORE

(75) Inventors: Kun-Lung Lin, Changhua (TW); Min-Chieh Chou, Taipei (TW); Cheng-Tang Pan, Nantou (TW)

(73) Assignee: Industrial Technology Research Institute, Hsinchu (TW)

( * ) Notice: Subject to any disclaimer, the term of this patent is extended or adjusted under 35 U.S.C. 154(b) by 64 days.

(21) Appl. No.: 10/161,421

(22) Filed: Jun. 1, 2002

(65) Prior Publication Data
US 2003/0224253 A1 Dec. 4, 2003

(51) Int. Cl.[7] .............................. G03F 9/00; C25D 5/02
(52) U.S. Cl. .................... 430/311; 430/330; 430/270.1; 257/741; 264/2.5; 264/1.36; 264/1.1; 428/172; 205/118; 205/122; 204/192.17
(58) Field of Search ................................. 430/311, 330, 430/270.1; 257/741; 264/2.5, 1.36, 1.1; 428/172; 205/118, 122; 204/192.17

(56) References Cited

U.S. PATENT DOCUMENTS

| | | | | |
|---|---|---|---|---|
| 5,325,265 A | * | 6/1994 | Turlik et al. ................. | 361/702 |
| 5,664,325 A | * | 9/1997 | Fukutomi et al. ............. | 29/848 |
| 6,503,384 B1 | * | 1/2003 | Teshima et al. ............ | 205/118 |
| 2002/0110757 A1 | * | 8/2002 | Fork et al. .................. | 430/320 |
| 2002/0114084 A1 | * | 8/2002 | Summersgill et al. ....... | 359/742 |

\* cited by examiner

*Primary Examiner*—Mark F. Huff
*Assistant Examiner*—Deborah Chacko-Davis
(74) *Attorney, Agent, or Firm*—W. Wayne Liauh

(57) ABSTRACT

A process of fabricating a non-gap 3-D microstructure array mold core comprises a first step in which a buffer layer is coated on a substrate. A photomask layer is then coated of the buffer layer. A pattern is subsequently formed on the photomask by photo-lithography. The patterned photomask layer is subjected to a reflow by which a microstructure array is formed on the photomask layer. The microstructure array is coated with a metal conductive layer. The microgaps of the microstructure array are eliminated by an electrocasting layer which is coated on the microstructure array. The non-gap microstructure array mold core so fabricated is made into a metal molding tool by microinjection molding or microthermo-pressure molding.

9 Claims, 3 Drawing Sheets

(D)

(A)

(B)

(C)

(D)

(A)

(B)

(C)

(D)

FABRICATING PROCESS OF NON-GAP 3-D MICROSTRUCTURE ARRAY MOLD CORE

FIELD OF THE INVENTION

The present invention relates to a filling technology capable of effective elimination of gap in microstructure array.

BACKGROUND OF THE INVENTION

The microlens is an essential component part of optical and optoelectronic products. For example, the microlens is used as a light condenser at the end of optical fiber, or as a focusing means of optical scanner. In addition, the microlens is used to construct the microlens array of display. Moreover, the microlens is used as a light condenser of micro-optic integrated element. The conventional process of making a microlens array is incapable of eliminating microgap of the microlens array. The microgap undermines the resolution of the product.

The Taiwan Pat. Series No. 89122015 discloses a batch process for fabricating microlens array. The process is described hereinafter with reference to FIG. 1. The process involves a first step in which a substrate 100 is coated with a polyimide composite layer 210 and a photomask composite layer 220. The coated substrate 100 is then patterned by lithography, thereby resulting in formation of a bottom layer of the polyimide composite 210 and a plurality of top layers of photomask composite 220, as shown in FIG. 1B and FIG. 1C. The patterned substrate 100 is heated subsequently at a temperature ranging between 180° C. and 220° C., so as to bring about reflow. In the meantime, the photomask layer 220 has transformed into a microlens 230 due to equilibrium of cohesive force and surface tension, as shown in FIG. 1D. In light of transformation of microlens array by reflow, the coated substrate 100 is patterned at intervals by lithography, so as to prevent the reflow overlapping phenomenon in the course of the reflow. As a result, there are gaps in the microlens array. The gaps undermine the resolution of the microlens array. The gaps of the microlens array may be eliminated by a presision mechanical process, a photomask process, or laser process. However, these processes are neither cost-effective nor efficient.

SUMMARY OF THE INVENTION

The primary objective of the present invention is to provide a filling technology capable of effective elimination of gaps in a microstructure array, thereby resulting in enhancement of resolution of the microstructure array.

It is another objective of the present invention to provide a process for fabricating a non-gap microstructure array in high density so as to reduce effectively the unit ares.

It is still another objective of the present invention to provide a simple and cost-effective process for fabricating microstructure arrays of various forms.

DETAILED DESCRIPTION OF THE INVENTION

The fabricating process of a non-gap 3-D microstructure array mold core of the present invention involves a first step in which a substrate is provided with a buffer coating of a high molecular substance. The substrate is subsequently provided with a photomask layer covering the buffer coating of the substrate. The photomask layer is formed of a pattern by lithography. The reflow process is brought about by heating the substrate at a temperature higher than the glass transformation temperature (Tg) of the photomask layer until such time when the photomask composite becomes a plurality of microstructure arrays, each being provided with a metal conductive layer by electroplating. Finally, the microstructure array is provided on the surface with a uniform metal layer by electrocasting. The elimination of gaps in the microstructure array is attained by the electrocasting layer, so as to conclude the fabrication of the mold core of the non-gap microstructure array.

By making use of the mold core of the non-gap 3-D microstructure array of the present invention, a metal molding tool can be made by a secondary electro-casting or electro-discharge finishing process, which is then followed by a microinjection molding or microthermopressure molding, thereby resulting in formation of a non-gap microstructure array.

Preferably, the substrate of the present invention is provided with the buffer layer and the photomask layer by spin coating, so as to ensure that the buffer layer and the photomask layer are uniformly formed on the substrate. Prior to being covered with the photomask layer, the buffer layer is preferably baked to enhance the adhesion of the high molecular buffer layer. The pattern is formed on the photomask layer by photo-lithography and etching. The high molecular buffer layer of the present invention is preferably made of polyimide or polyamide. The photomask layer of the present invention is preferably made of a polymer, which has a glass transformation temperature (Tg) in the range of 100° C. and 350° C. The polymer is preferably polymethacrylic acid series. The reflow process is carried out by heating the patterned photomask layer at a working temperature which is higher than the glass transformation temperature (Tg) of the photomask composite. The formas and the locations of the pattern of the present invention can be controlled by lithography. The metal conductive layer of the surface of the microstructure of the present invention is preferably furnished by sputtering. The metal conductive layer is preferably made of copper. The elimination of gaps of the microsturcture of the present invention is attained preferably by an electrocasting layer of nickel. The nickel (Ni) electrocasting layer has a relatively high surface precision and a relatively small grain structure.

Figure 1:
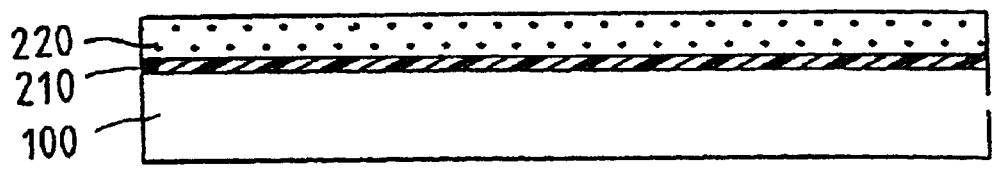
FIG. 1 shows a process flow of the prior art for fabricating a microlens array.
Figure 1:
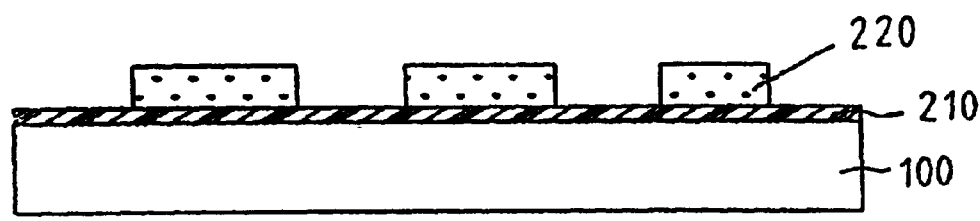
Figure 1:
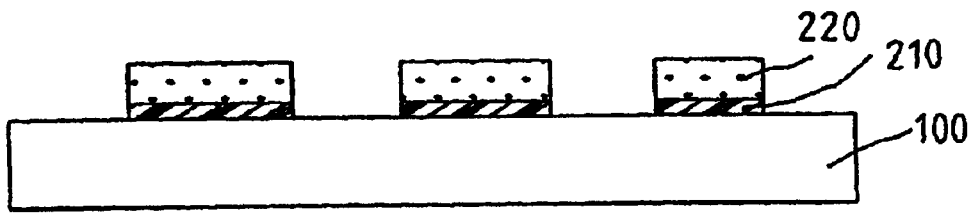
Figure 1:
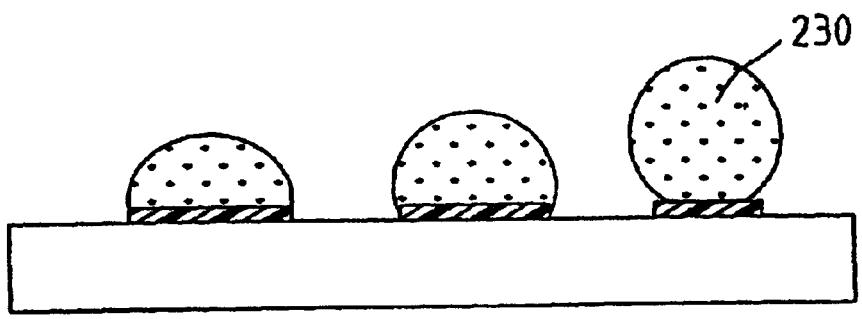
Figure 2:
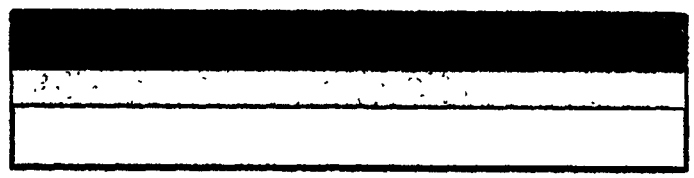
FIG. 2 shows a process flow of the present invention for fabricating a non-gap microstructure array mold core.
Figure 2:
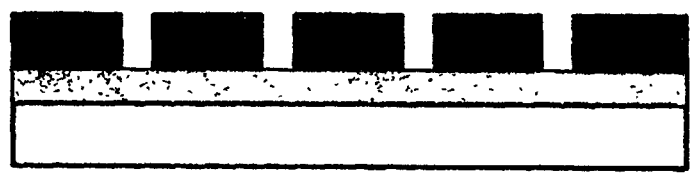
Figure 2:
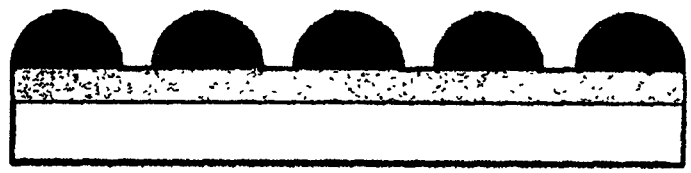
Figure 2:
Figure 3:
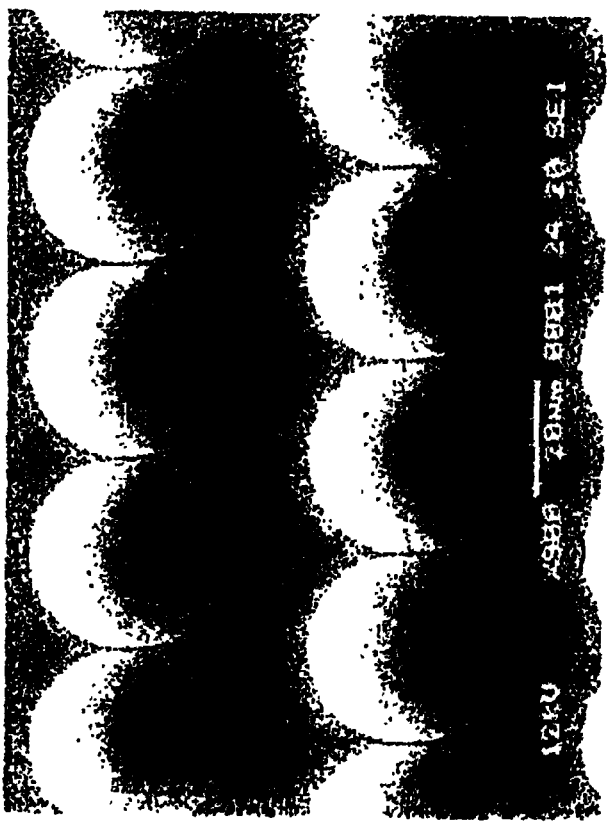
FIG. 3 shows a magnified view of a product made by the present invention.

The features and the advantages of the present invention will be more readily understood upon a thoughtful deliberation of the following detailed description of a preferred embodiment of the present invention with reference to FIGS. 2 and 3.

As shown in FIG. 2, a process of the present invention is used to fabricate a microlens array. The process comprised a first step in which a polyimide buffer layer 310 is uniformly coated on a substrate 300 by spin coating. The coated substrate 300 is then baked at a temperature of 350° C. for 30 minutes. Thereafter, the substrate 300 is provided with a photomask 320 of polyacrylic acid polymer, which is uniformly coated on the polyimide buffer layer 310 by spin coating, as shown in FIG. 2(A).

As shown in FIG. 2(B), a pattern array is formed on the potomask 320 by lithography. Thereafter, the patterned substrate 300 is subjected to a reflow process by heating the patterned substrate 300 at a glass transformatin temperature (Tg) ranging between 180° C. and 220° C., preferably at 190° C., thereby resulting in formation of a microlens array on the substrate 300, as shown in FIG. 2(C). Upon completion of a process of cooling the microlens array and the substrate, the microlens array is provided with a copper (Cu) conductive layer 330 by sputtering.

As shown in FIG. 2(D), the coated microlens array is uniformly provided with a nickel (Ni) electro-casting layer 340 by electrocasting, thereby resulting in elimination of gaps in the microlens array. The fabricating process of a non-gap 3-D microlens array mold core if thus concluded.

The mold core so fabricated by the present invention can be made into a metal molding tool by a secondary electro-casting or electro-discharge finishing process. A non-gap microlens array is formed by microinjection molding or microthermo-pressure molding, as shown in FIG. 3. The process of the present invention is cost-effective and efficient. In addition, the product made by the method of the present invention is relatively high in resolution.

What is claimed is:

1. A process for fabricating a non-gap 3-D microstructure array mold core, said process comprising the following steps of:

(a) preparing a substrate;

(b) coating on the substrate a high molecular buffer layer;

(c) coating a photomask layer on the high molecular buffer layer;

(d) forming a pattern of the photomask layer by lithography;

(e) preparing a reflow by heating the patterned photomask layer at a temperature higher than the glass transformation temperature of a composite of which the photomask layer is formed, thereby resulting in formation of a microstructure array having a plurality of spaced apart microstructures;

(f) cooling the microstructure array;

(g) coating uniformly a metal conductive layer on the spaced apart microstructures of the microstructure array; and (h) eliminating microgaps of the microstructure array by coating the microstructure array with an electro-casting layer.

2. The process as defined in claim 1, wherein the high molecular buffer layer is formed of a polyimide composite.

3. The process as defined in claim 1, wherein the photomask layer is formed of a polyacrylic acid polymer.

4. The process as defined in claim 1, wherein the buffer layer and the photomask layrer are coated on the substrate by spin coating.

5. The process as defined in claim 1, wherein the buffer layer is baked at a temperature of 350° C. after the buffer layer is coated on the substrate in the step (b).

6. The process as defined in claim 1, wherein the reflow of the step (e) is carried out at a temperature ranging between 180° C. and 220° C.

7. The process as defined in claim 1, wherein the metal conductive layer is coated on the microstructure array by sputtering in the step (g).

8. The process as defined in claim 7, wherein the metal conductive layer is formed of copper.

9. The process as defined in claim 1, wherein the electro-casting layer of the step (h) is formed of nickel.

\* \* \* \* \*